(12) United States Patent
Iemura

(10) Patent No.: US 6,442,383 B1
(45) Date of Patent: Aug. 27, 2002

(54) DEMODULATOR AND DIGITAL WIRELESS COMMUNICATION RECEIVER

(75) Inventor: Takaya Iemura, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/276,161

(22) Filed: Mar. 25, 1999

(30) Foreign Application Priority Data

Mar. 27, 1998 (JP) ............................................ 10-081889

(51) Int. Cl.$^7$ ................................................. H04B 1/10
(52) U.S. Cl. ........................ 455/312; 375/317; 375/326; 375/319
(58) Field of Search ........................ 455/214, 314, 455/312, 324, 245.1; 375/304, 324, 329, 334, 349, 350, 345, 347, 317, 319, 326; 329/304, 308, 310, 300

(56) References Cited

U.S. PATENT DOCUMENTS

| | | | | |
|---|---|---|---|---|
| 5,173,663 A | * | 12/1992 | Ichiyoshi | 329/304 |
| 5,260,975 A | * | 11/1993 | Saito | 375/324 |
| 5,610,948 A | * | 3/1997 | Ninomiya et al. | 375/324 |
| 5,699,383 A | * | 12/1997 | Ichiyoshi | 375/297 |
| 5,771,224 A | * | 6/1998 | Seki et al. | 370/206 |
| 5,905,405 A | * | 5/1999 | Ishizawa | 329/308 |
| 6,009,126 A | * | 12/1999 | Van Bezooijen | 375/319 |
| 6,023,491 A | * | 2/2000 | Saka et al. | 375/326 |
| 6,133,964 A | * | 10/2000 | Han | 348/726 |

FOREIGN PATENT DOCUMENTS

| | | |
|---|---|---|
| JP | 8-223237 | 8/1996 |
| JP | 8-307465 | 11/1996 |
| JP | 10-41992 | 2/1998 |

OTHER PUBLICATIONS

Japanese Office Action, dated Feb. 20, 2001, with English language translation of Japanese Examiner's comments.

* cited by examiner

*Primary Examiner*—Dwayne Bost
*Assistant Examiner*—Joy K. Contee
(74) *Attorney, Agent, or Firm*—Whitham, Curtis & Christofferson, P.C.

(57) ABSTRACT

A demodulator for use with a digital wireless communication system is disclosed, that comprises a DC offset controller for removing a DC offset of a modulated signal that is input to the demodulator, a complex multiplying unit for complex-multiplying an output signal of the DC offset controller, a phase detector for detecting an amplitude error signal and a phase error signal from an output signal of the complex multiplying unit, an LPF (low pass filter) for outputting a low band component of the phase error signal, and an NCO (numerical controlled oscillator) for converting an output signal of the LPF into a sin component and a cos component that have orthogonal relation, wherein the sin component and the cos component are input to the complex multiplying unit, and wherein the amplitude error signal, the sin component, and the cos component are input to the DC offset controller.

23 Claims, 9 Drawing Sheets

EXAMPLE OF STRUCTURE OF PHASE DETECTOR

EXAMPLE OF STRUCTURE OF LPF

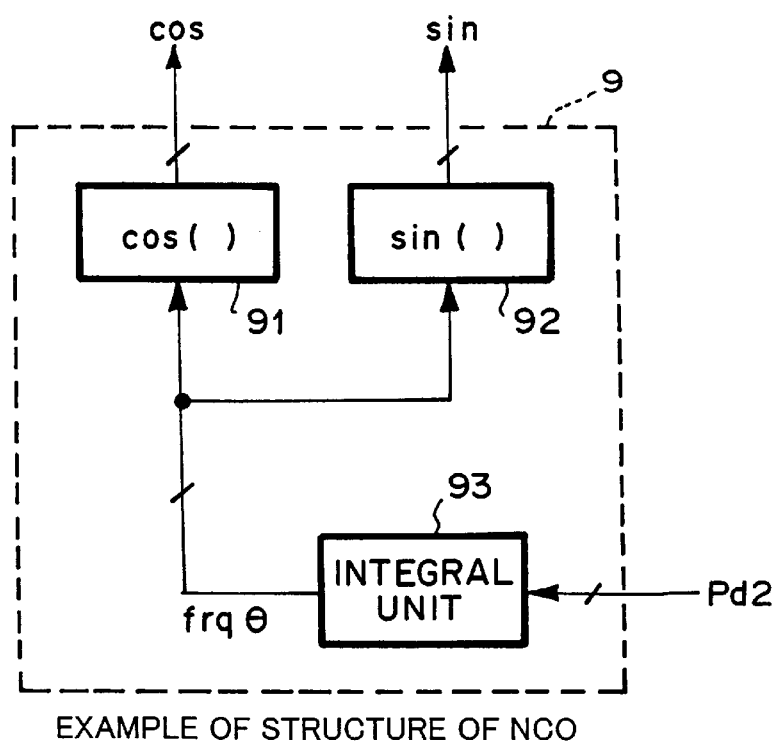
EXAMPLE OF STRUCTURE OF NCO
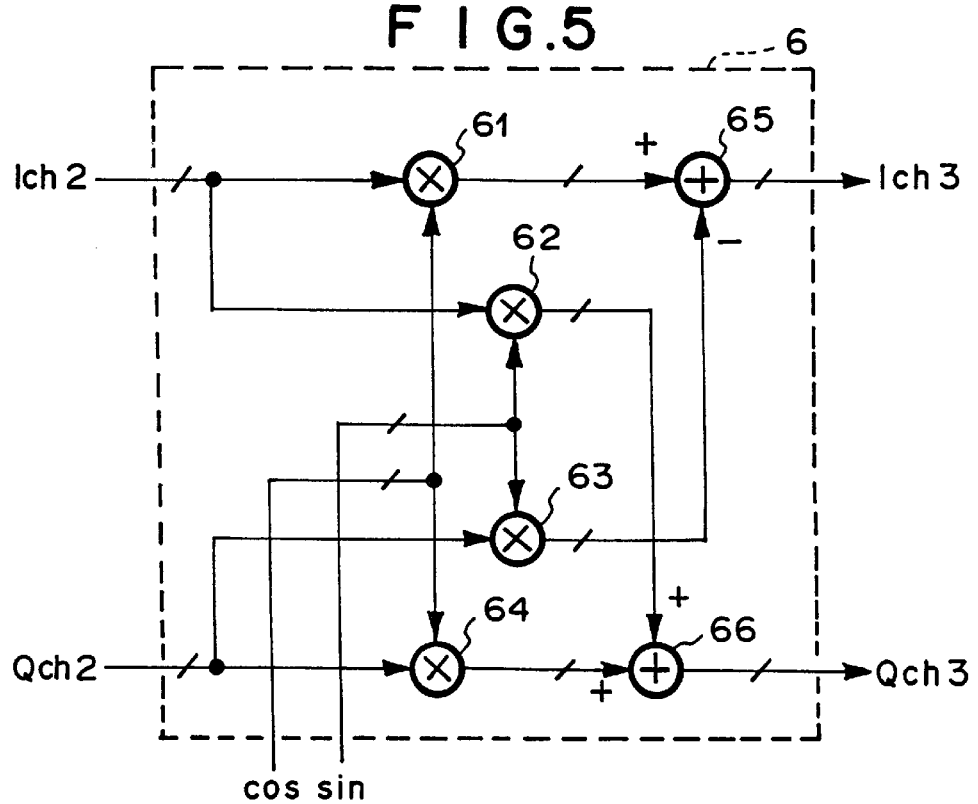
EXAMPLE OF STRUCTURE OF COMPLEX MULTIPLYING UNIT

FIRST EXAMPLE OF STRUCTURE OF DC OFFSET CONTROLLER

FIRST EXAMPLE OF STRUCTURE OF LPF

INVERSE ROTATION OF ERROR SIGNAL

SECOND EXAMPLE OF STRUCTURE OF LPF

DC OFFSET CONTROL (ORTHOGONAL PLANE)

DC OFFSET CONTROL (Qch)

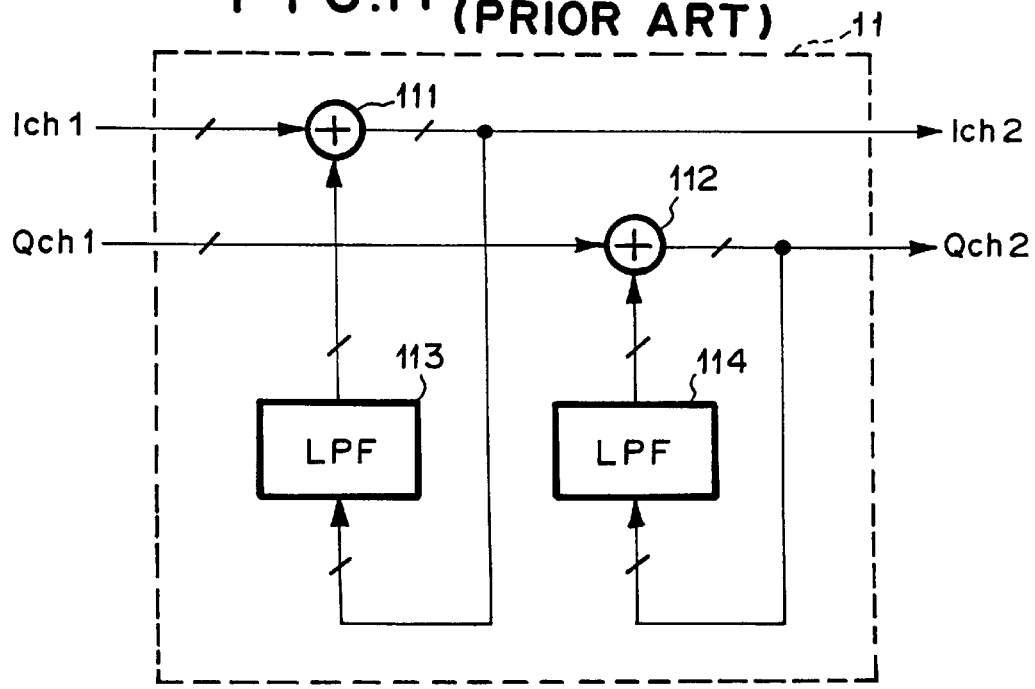
EXAMPLE OF STRUCTURE OF DC OFFSET CONTROLLER
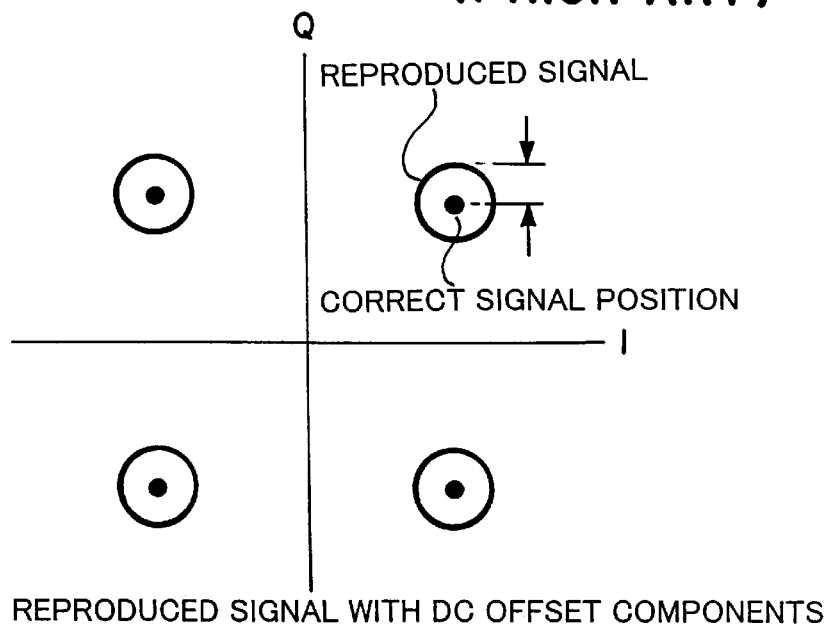
REPRODUCED SIGNAL WITH DC OFFSET COMPONENTS

DEMODULATOR AND DIGITAL WIRELESS COMMUNICATION RECEIVER

BACKGROUND OF THE INVENTION

1. Field of the Invention

The present invention relates to a demodulator for used with a wireless communication receiver, in particular, to a demodulator having a DC offset controller that controls a frequency offset with an angle signal and an error signal.

2. Description of the Related Art

In recent years, digital wireless communication systems using microwaves and ultra-microwaves have been widely used along with analog wireless communication systems. In particular, mobile wireless communication systems such as portable telephone system and PHS (Persona Handyphone System) have been actively developed and invested as an infrastructure of digital communication lines.

In a demodulator of a digital wireless communication system, a frequency offset has been controlled so as to suppress data errors and accurately demodulate data. FIG. 11 is a block diagram showing the structure of a demodulator for use with a conventional digital wireless communication system. In FIG. 11, the demodulator comprises multiplying units 1 and 2, an oscillator 5, A/D converters 3 and 4, a complex multiplying unit 6, a phase detector 7, an LPF 8, an NCO (Numerical Controlled Oscillator) 9, a DC offset controller 11, and a Π/2 shifter 12.

In a receiver of a digital wireless communication system, a received radio signal is down-converted into a desired IF signal. The resultant IF signal is supplied to the demodulator as shown in FIG. 11. The detecting method of the demodulator is for example quasi-synchronous detecting method. The input modulated signal is an orthogonally modulated signal corresponding to QPSK method or QAM method. Orthogonal components (channels) of the modulated signal are denoted by Ich (In-Phase Channel) and Qch (Quadri-Phase Channel).

The oscillator 5 is a local oscillator with the same frequency as that of the input IF signal. An output signal of the oscillator 5 and a signal of which the phase of the output signal of the oscillator 5 is shifted for Π/2 by the Π/2 shifter 12 are multiplies by the IF signal of the IF-IN. Thus, signal components I and Q that are base band signals of the signals Ich and Qch are obtained. The signal components I and Q are supplied to the A/D converters 3 and 4, respectively. The A/D converters 3 and 4 convert the signal components I and Q into digital signals I1 and Q1, respectively. Since the demodulator performs the quasi-synchronous detection, the digital signals I1 and Q1 are not perfect base band signals. Instead, the digital signals I1 and Q1 contain carrier frequencies.

The DC offset controller 11 inputs the digital signals I1 and Q1, removes DC offset components from the digital signals I1 and Q1, and outputs signals I2 and Q2.

The complex multiplying unit 6 inputs the signals I2 and Q2, removes carrier frequencies from the signals I2 and Q2 using rotation angle information sin and cos that are input from the NCO 9, and outputs resultant signals Ich4 and Qch4.

The phase detector 7 inputs the signals Ich4 and Qch4 from the complex multiplying unit 6 and outputs a phase error signal Pd1. The phase error signal Pd1 is supplied to the LPF 8. The LPF 8 smooths the phase error signal Pd1 and outputs the resultant phase error signal Pd2 to the NCO 9.

The NCO 9 converts the phase error signal Pd2 that is input from the LPF 8 into rotation angle signals sin and cos.

The output signals Ich4 and Qch4 of the complex multiplying unit 6 are converted into a serial signal. Thus, original digital data can be obtained.

Next, another structure of the DC offset controller 11 will be described. In the structure, the DC offset controller 11 controls a DC offset with information other than error information that is output from the complex multiplying unit 6.

FIG. 7 shows an influence of a DC offset upstream of the complex multiplying unit that compensates a frequency/phase offset. In FIG. 7, a polarity determining unit 121 determines the polarities of digital signals Ich1 and Qch1. An adding unit 123 adds the output signals of the polarity determining unit 121 with an output signal of the adding unit 123. A flip-flop F/F 122 temporarily stores an output signal of the adding unit 123. Corresponding to the stored polarity, the polarity determining unit 121 determines whether or not a DC offset is present.

FIG. 12 shows an influence of a DC offset upstream of the complex multiplying unit 6 that compensates a frequency/phase offset in a modulating method of which signal points are present on a concentric circle. Dots on the circle represent signals in the case that DC offset components are present on both Ich and Qch. Since the frequence/phase offset has not been compensated, the signals are offset to the origin of the coordinates. When the DC offset is removed from the signals, the resultant signals are represented as a solid circle whose center is at the origin of the coordinates.

FIG. 13 shows a signal on only Qch (or Ich) in the case that the signal has a DC offset. The signal reciprocally moves on a straight line. The signal deviates to the axis I. In FIG. 13, the probability of which the value on Q'ch is positive is higher than the probability of which the value on Q'ch is negative. When the DC offset is removed from the signal, the resultant signal distributes symmetrically to the axis I as denoted by a solid line Qch.

FIG. 14 is a block diagram showing an example of the structure of the conventional DC offset controller 11. In FIG. 14, the DC offset controller 11 comprises adding units 111 and 112 and LPFs 113 and 114. In the DC offset controllers 11, the adding units 111 and 112 remove low band components including DC components that are output components of the LPFs 113 and 114 and output signals Ich2 and Qch2 of which DC offset components are removed.

In the conventional structure, although error information is not obtained, when DC offset components are present, since the probability of which each of signals Ich and Qch is positive is different from the probability of which each of signals Ich and Qch is negative, the DC offset components can be controlled corresponding to polarity signals on Ich and Qch. Since the polarity signals are used as control signals, LPFs shown in FIG. 7 or 9 are used. When an input signal is positive, a subtracting operation or a count-down operation is performed. When an input signal is negative, an adding operation or a count-up operation is performed. Thus, the probability of which each signal is positive becomes the same as the probability of which each signal is negative. Thus, the DC offset components are removed.

However, as described above, in the conventional structure, although DC offset components can be removed, since only polarities as control information are used, the DC offset control becomes coarse.

As denoted by I-Q coordinates shown in FIG. 15, when signals that are output from the complex multiplying unit 6 contain DC offset components, the signals are denoted as circles with radiuses of DC offset components. FIG. 15 shows signals in the QPSK modulating method. Likewise, in other modulating methods, signals are denoted as circles with centers of correct signal points. Thus, when the distance between signal points is short, the signals are easily affected by noise and thereby the error rate characteristics deteriorate.

In particular, when a signal is transmitted with many value data for a large capacity of a communication line, due to a DC offset, the distance between signal points further shortens. Thus, the error rate characteristics remarkably deteriorate.

SUMMARY OF THE INVENTION

An object of the present invention is to provide a demodulator for accurately removing a DC offset so as to more suppress deterioration of error rate characteristics than conventional demodulators in the case that a modulating method with many-value data and short signal distance is used.

A first aspect of the present invention is a demodulator for use with a digital wireless communication system, comprising a DC offset controller for removing a DC offset of a modulated signal that is input to the demodulator, a complex multiplying unit for complex-multiplying an output signal of the DC offset controller, a phase detector for detecting an amplitude error signal and a phase error signal from an output signal of the complex multiplying unit, an LPF (low pass filter) for outputting a low band component of the phase error signal, and an NCO (numerical controlled oscillator) for converting an output signal of the LPF into a sin component and a cos component that have orthogonal relation, wherein the sin component and the cos component are input to the complex multiplying unit, and wherein the amplitude error signal, the sin component, and the cos component are input to the DC offset controller.

The phase detector multiplies and adds an output signal of the complex multiplying unit and the amplitude error signal that is output from the error detector and obtains the phase error signal.

The DC offset controller multiplies the amplitude error signal by the sin component, multiplies the amplitude error signal by the cos component, adds one of the multiplied results and the other of the multiplied results, subtracts one of the multiplied results from the other of the multiplied results, extracts low band components of the added result and the subtracted result through the LPF, adds or subtracts the low band components to/from the orthogonal modulated signal component, and outputs the result as an orthogonal modulated signal component.

A second aspect of the present invention is a digital wireless communication receiver having a demodulator for demodulating transmitted digital data, wherein the demodulator is the demodulator of the first aspect.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 4 is a block diagram showing the structure of an NCO according to the first embodiment of the present invention;

FIG. 5 is a block diagram showing the structure of a complex multiplying unit according to the first embodiment of the present invention;

FIG. 14 is a block diagram showing the structure of a conventional DC offset controller; and FIG. 15 is a graph showing I-Q characteristics of a conventional DC offset control.

DESCRIPTION OF PREFERRED EMBODIMENTS

Next, with reference to the accompanying drawings, embodiments of the present invention will be described.

[First Embodiment]

Figure 1:
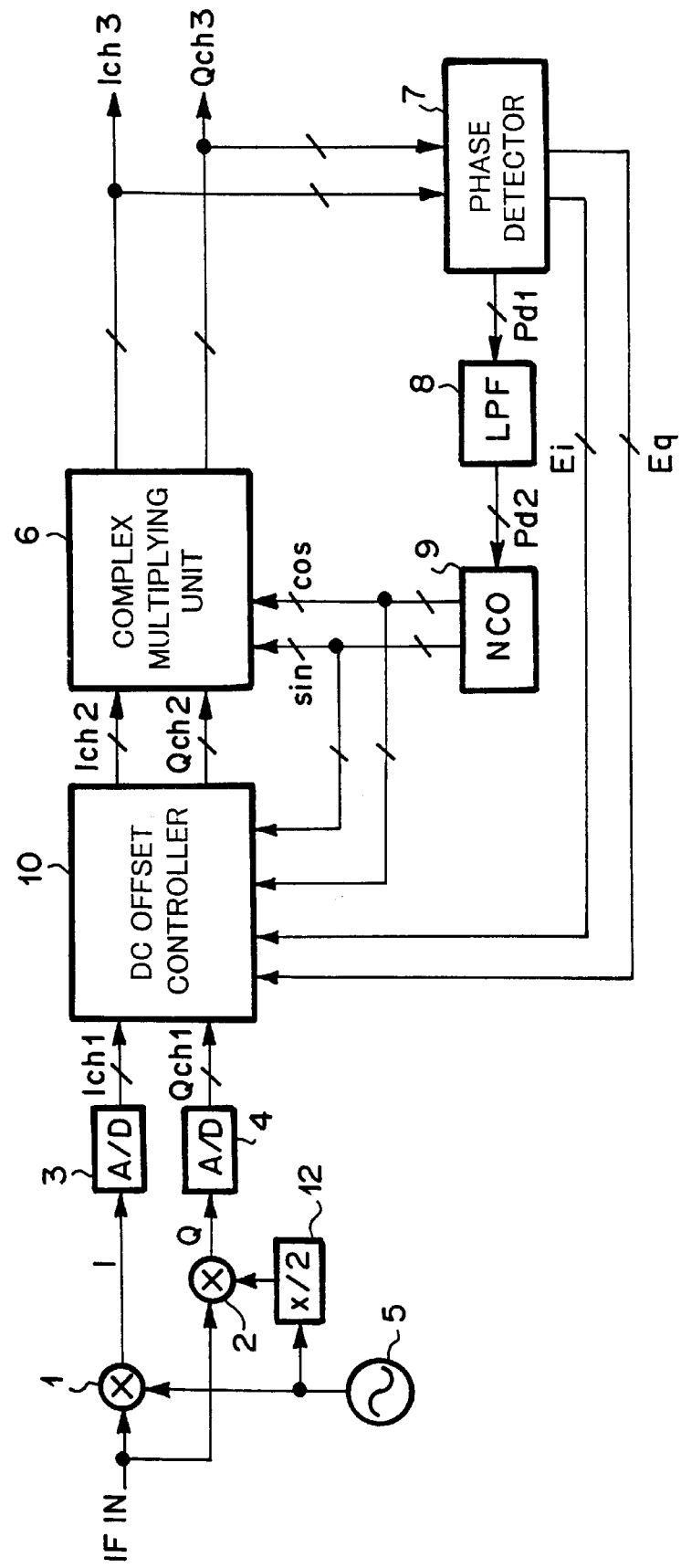
FIG. 1 is a block diagram showing the structure of a demodulator according to a first embodiment of the present invention.

Next, with reference to FIG. 1, a first embodiment of the present invention will be described. FIG. 1 shows the structure of a demodulator according to the first embodiment of the present invention. The demodulator comprises multiplying units 1 and 2, an oscillator 5, A/D converters 3 and 4, a complex multiplying unit 6, a phase detector 7, an LPF 8, an NCO (Numerical Controlled Oscillator) 9, a DC offset controller 10, and a Π/2 shifter 12.

In the following description, the detecting method of the demodulator is for example quasi-synchronous detecting method. The input modulated signal is an orthogonally modulated signal corresponding to QPSK method or QAM method. Orthogonal components (channels) of the modulated signal are denoted by Ich and Qch.

An input signal IF-IN of the demodulator shown in FIG. 1 is obtained from an IF amplifying circuit (that amplifies an intermediate frequency signal) through an antenna (that receives a radio signal), a radio frequency amplifying circuit (that amplifies the received signal), a mixing circuit (that converts the amplified signal into an intermediate frequency signal), and a local oscillation circuit (that inputs a local oscillation frequency signal to the mixing circuit). Next, each circuit block shown in FIG. 1 will be described in detail.

The oscillator 5 is a local oscillator that generates a local oscillation signal at a frequency that is almost the same as that of the input IF signal. An output signal of the oscillator 5 and a signal of which the phase of the output signal of the oscillator 5 is shifted for Π/2 by the Π/2 shifter 12 are multiplied by the IF-IN. Thus, signal components Ich and Qch are obtained.

The A/D converters 3 and 4 convert the signal components on Ich and Qch into digital signals Ich1 and Qch1. Since the demodulator performs the quasi-synchronous detection, the digital signals Ich1 and Qch1 are not perfect base band signals. Instead, the digital signals Ich1 and Qch1 contain carrier frequencies.

The DC offset controller 10 inputs the digital signals Ich1 and Qch1, removes DC offset components from the digital signals Ich1 and Qch1 using amplitude error signals Ei and Eq that are input from the phase detector 7 and rotation angle signals sin and cos that are input from the NCO 9, and outputs signals Ich2 and Qch2.

The complex multiplying unit 6 inputs the signals Ich2 and Qch2, removes carrier frequencies from the signals Ich1 and Qch1 using rotation angle information sin and cos that are input from the NCO 9, and outputs resultant signals Ich3 and Qch3.

Next, the phase detector 7 outputs a phase error signal Pd and amplitude error signals Ei and Eq using the signals Ich3 and Qch3 that are input from the complex multiplying unit 6. Thus, carrier frequencies have been removed from the signals Ich3 and Qch3. Next, the phase error signal Pd1 is supplied to the LPF 8. The LPF 8 smooths the phase error signal Pd1 and outputs the resultant signal as a phase error signal Pd2 to the NCO 9.

The NCO 9 converts the phase error signal Pd2 that is input form the LPF 8 into rotation angle signals sin and cos.

The signals Ich3 and Qch3 are converted into serial signals I and Q. The signals I and Q are output to a data signal processing circuit.

Next, each circuit block will be described in detail.

Figure 2:
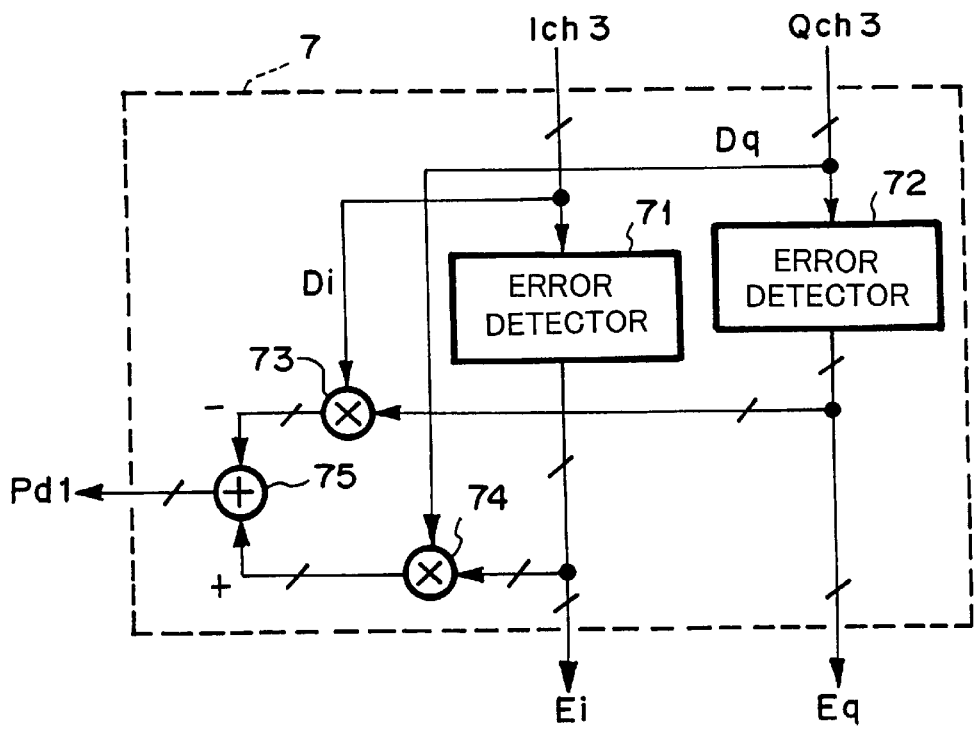
FIG. 2 is a block diagram showing a phase detector according to the first embodiment of the present invention.

FIG. 2 is a block diagram showing an example of the structure of the phase detector 7. In FIG. 2, the phase detector 7 comprises error detectors 71 and 72, multiplying units 73 and 74, and an adding unit 75.

The error detectors 71 and 72 detect errors of the input signals Ich3 and Qch3 against their normal signal point positions and output the detected errors as amplitude error signals Ei and Eq. In this example, when the input signals Ich3 and Qch3 deviate in the positive direction against the normal signal point positions, the error signals Ei and Eq become negative. In contrast, when the input signals Ich3 and Qch3 deviate in the positive direction against the normal signal point positions, the error signals Ei and Eq become positive. With the error signals Ei and Eq and polarity signals Di and Dq of the signals Ich3 and Qch3 (the polarity signals Di and Dq are MSBs of the signals Ich3 and Qch3), a phase error signal Pd1 is obtained.

Figure 3:
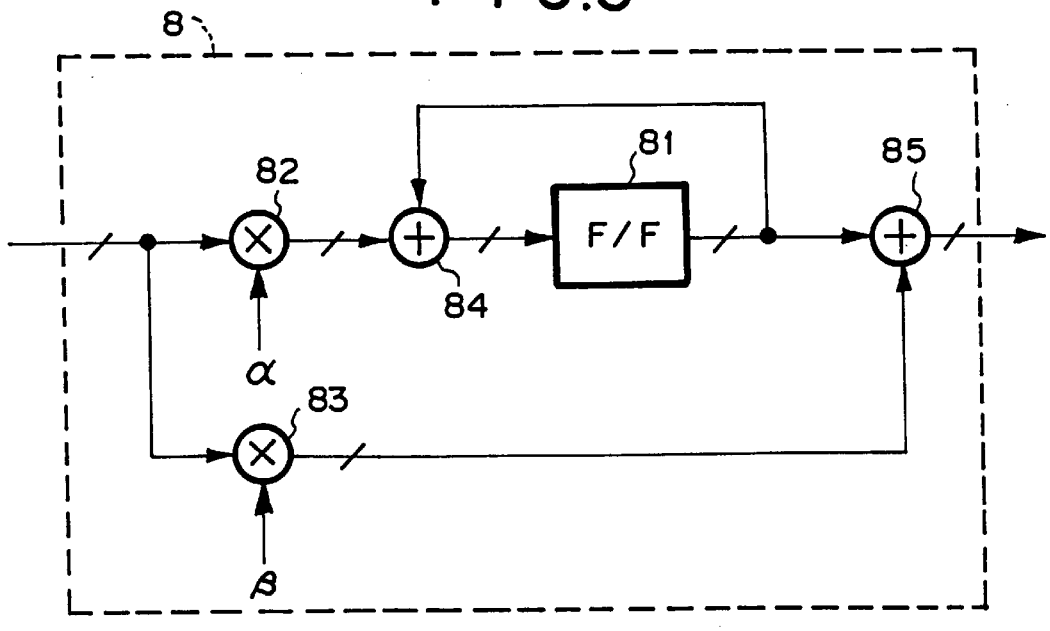
FIG. 3 is a block diagram showing the structure of an LPF according to the first embodiment of the present invention.

FIG. 3 is a block diagram showing an example of the structure of the LPF 8. In FIG. 3, the LPF 8 comprises a flip-flop F/F 81, multiplying units 82 and 83, and adding units 84 and 85. The multiplying units 82 and 83 multiply the input phase error signal Pd1 by multiplying coefficients α and β, respectively. The multiplying coefficients α and β are parameters that define characteristics of the LPF 8. The multiplying coefficients α and β are optimized so as to satisfy the follow-up characteristics against a required input signal and stability of an output signal.

The LPF 8 is a conventional quadratic lag lead filter. Normally, in a carrier reproduction loop composed of the complex multiplying unit 6, the phase detector 7, the LPF 8, and the NCO 9, the LPF 8 should be structured at least quadratically. To do that, with two or three stages of the LPFs 8, a high order low pass filter is structured. Thus, with a high order carrier reproduction loop, a frequency offset can be canceled.

FIG. 4 is a block diagram showing an example of the structure of the NCO 9. In FIG. 4, the NCO 9 comprises an integrating unit 93, a cos ( ) 91, and a sin ( ) 92. The integrating unit 93 integrates the phase error signal Pd2 smoothed by the LPF 8 and outputs a frequency error signal θ. The cos ( ) 91 and the sin ( ) 92 are calculating units that input the frequency error signal θ and output cos (θ) and sin (θ) as angle signals sin and cos.

FIG. 5 is a block diagram showing an example of the structure of the complex multiplying unit 6. In FIG. 5, the complex multiplying unit 6 comprises multiplying units 61 to 64 and adding units 65 and 66.

The multiplying units 61 and 64 multiply output signals Ich2 and Qch2 of the DC offset controller 10 by the output signal cos (θ) of the NCO 9. In addition, the multiplying units 62 and 63 multiply the signals Ich2 and Qch2 by the output signal sin (θ) of the NCO 9. The adding unit 65 subtracts an output signal of the multiplying unit 63 from an output signal of the multiplying unit 61 and outputs a signal Ich3. The adding unit 64 adds an output signal of the multiplying unit 62 and an output signal of the multiplying unit 64a and outputs a signal Qch3.

The complex multiplying unit 6 shown in FIG. 5 removes carrier frequencies and phase offset components from the signals Ich2 and Qch2.

Figure 6:
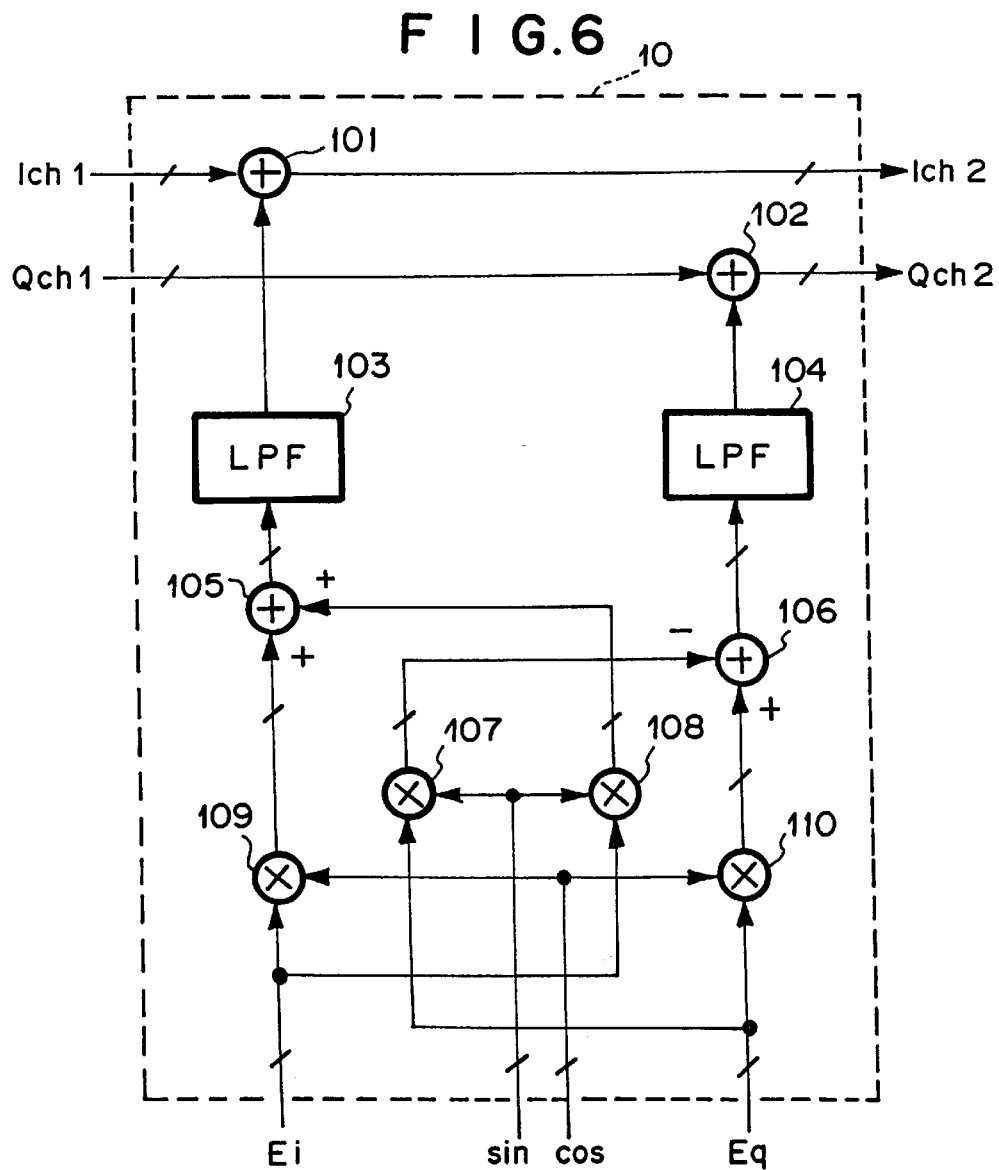
FIG. 6 is a block diagram showing the structure of a DC offset controller according to the first embodiment of the present invention.

FIG. 6 is a block diagram showing the structure of the DC offset controller 10. In FIG. 6, the DC offset controller 10 comprises adding units 101 and 102, multiplying units 107 to 110, adding units 105 and 106, and LPFs 103 and 104.

In FIG. 6, the multiplying units 109 and 110 multiply the output error signals Ei and Eq of the phase detector 7 by the output signal cos (θ) of the NCO 9, respectively. The multiplying units 107 and 108 multiply the error signals Ei and Eq by the output signal sin (θ) of the NCO 9, respectively. The adding unit 105 adds an output signal of the multiplying unit 109 and an output signal of the multiplying unit 108. The adding unit 106 subtracts an output signal of the multiplying unit 107 from an output signal of the multiplying unit 110. Output signals of the adding units 105 and 106 are input to the LPF 103 and the LPF 104. The LPF 103 and the LPF 104 pass low band components of the output signals of the adding units 105 and 106. The output signals Ich1 and Qch1 of the A/D converters 3 and 4 are added and output as signals Ich2 and Qch2, respectively.

The calculating circuit composed of the adding units 105 and 106 and the multiplying units 107 to 110 in FIG. 6 are almost the same as the complex multiplying unit 6 shown in FIG. 5. The rotating direction of the calculating circuit shown in FIG. 6 is different from the rotating direction of the complex multiplying unit 6 shown in FIG. 6. The error signals Ei and Eq that are input from the phase detector 7 are inversely rotated with the angle signals sin and cos. The complex multiplying unit 6 restores the original signal. The inversely rotated signals are smoothed by the LPFs 103 and 104. The resultant signals are added to the input signals Ich1 and Qch1. Thus, the DC offset components are removed.

Figure 7:
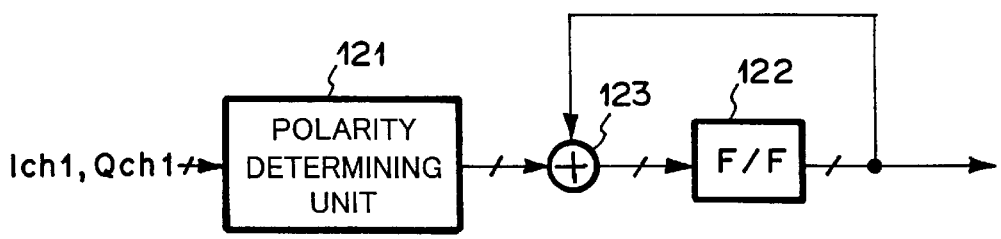
FIG. 7 is a block diagram showing the structure of an LPF according to the first embodiment of the present invention.

FIG. 7 is a block diagram showing an example of the structure of each of the LPFs 103 and 104 of the DC offset controller 10. In FIG. 7, each of the LPFs 103 and 104 comprises a polarity determining unit 121, a flip-flop F/F 122, and an adding unit 123. Normally, a DC offset is a regular offset due to imperfectness of hardware. Thus, the LPFs 103 and 104 can be accomplished by simple filters that integrate a polarity signal (namely, the LSB of a signal).

[Operation of First Embodiment]

Next, the operation of the DC offset controller 1 that is a feature of the present invention will be described as the operation of the first embodiment.

In FIG. 1, the DC offset controller 10 is operated with the amplitude error signals Ei and Eq before the complex multiplying unit 6 rotates the phases of the signals. However, the amplitude error signals Ei and Eq are obtained from signals whose phases have been rotated. Thus, error information of which the phases of signals have not been rotated should be estimated with the obtained error information.

Thus, the amplitude error signals Ei and Eq and the phase error signals Pd1 are obtained by the phase detector 7 shown in FIG. 2. The amplitude error signals Ei and Eq can be obtained by detecting errors of the input signals Ich3 and Qch3 against the original signal point positions. With the amplitude error signals Ei and Eq and the polarity signals Di and Dq (MSBs) of the output signals Ich3 and Qch3 of the complex multiplying unit 6, the phase error signal Pd1 is expressed by the following formula.

$$Pd1 = Ei \cdot Dq - Eq \cdot Di$$

A phase error is converted into a frequency error by the NCO 9 shown in FIG. 4. Since a frequency is obtained by integrating a phase, after the phase error signal Pd1 is smoothed by the LPF 8 and then integrated, a frequency error signal θ is obtained. The frequency error signal θ is converted into rotation angle signals sin (θ) and cos (θ). The rotation angle signals sin (θ) and cos (θ) are output from the NCO 9. FIG. 5 is a block diagram showing an example of the structure of the complex multiplying unit 6. The block diagram shown in FIG. 5 represents calculations expressed by the following formulas.

$$Ich3 = Ich2 \cos(\theta) - Qch2 \sin(\theta)$$

$$Qch3 = Ich2 \sin(\theta) + Qch2 \cos(\theta)$$

In other words, calculations for rotating the signals Ich2 and Qch2 by the angle signal θ obtained from the error signal are repeated in the loop composed of the phase detector 7, the LPF 8, and the NCO 9. Thus, the carrier frequencies and phase offset components contained in the signals Ich1 and Qch1 are controlled.

On the other hand, calculations performed by the multiplying units and the adding units of the DC offset controller 10 shown in FIG. 6 are expressed by the following formulas.

$$Ei' = Ei \cos(\theta) - Eq \sin(\theta)$$

$$Eq' = Ei \sin(\theta) + Eq \cos(\theta)$$

Thus, the inverse rotation of the complex multiplying unit 6 is performed for the signals Ei and Eq.

Figure 8:
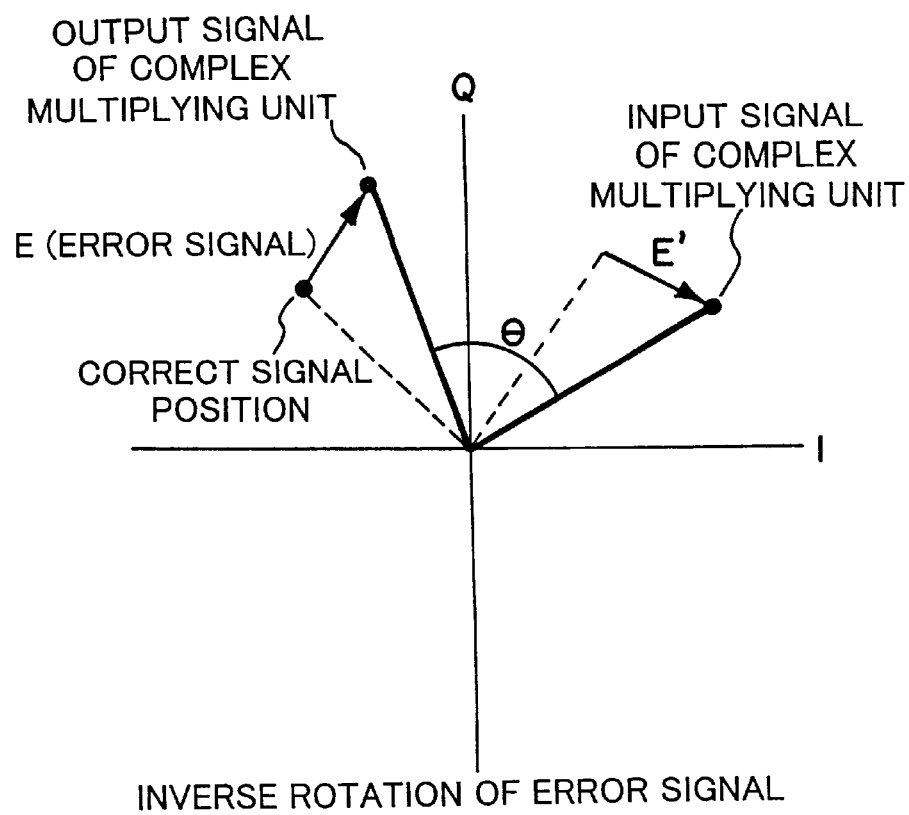
FIG. 8 is a graph showing I-Q characteristics of an error signal corresponding to an error signal according to the first embodiment of the present invention.

FIG. 8 shows the relation between the error signals E and E' on I-Q phase plane. A vector that orients from the correct signal point position to the output signal of the complex multiplying unit 6 is an error signal obtained by the phase detector 7. When the phase of the error signal is rotated for θ by the complex multiplying unit 6, the input signal (whose phase has not been rotated) of the complex multiplying unit 6 is obtained by rotating the output signal of the complex multiplying unit 6 for −θ. Thus, the error signal E' whose phase has not been rotated is obtained by rotating the error signal E for −θ. As shown in FIG. 6, when the error signal E' is smoothed by the LPFs 103 and 104 and input to the input signals Ich1 and Qch1, since the error signal converges to zero, the DC offset components can be removed.

Thus, the DC offset components can be removed by the DC offset controller 10 using the error signals Ei and Eq and the phase error signals sin and cos detected by the phase detector 7. The frequency offset can be removed from the AC error signal by the carrier reproduction loop composed of the complex multiplying unit 6 and the NCO 9.

In other words, in the demodulator, the DC offset controller 10 complex-multiplies the error signals Ei and Eq that are output from the phase detector 7 by sin and cos that are output from the NCO 9 so as to estimate error information whose phases have not been rotated using the error signals Ei and Eq whose phases have been rotated by the complex multiplying unit 6. The DC offset controller controls (removes) the DC offset components with the estimated error information.

Since the amplitude error signals Ei and Eq contains accurate DC offset information, the demodulator according to the present invention can more accurately control (remove) the DC offset components than the conventional demodulator that controls them with information that has not been complex-multiplied.

In the first embodiment, the detecting method of the demodulator is the quasi-synchronous detecting method and the input modulation signal is a signal that is orthogonally modulated corresponding to the QPSK or QAM method. However, as long as error information whose frequencies/phase offset components have been compensated and rotation angle information whose frequencies/phase offset components are compensated are obtained, the detecting method of the demodulator may not be the quasi-synchronous detecting method. In other words, another modulating method such as PSK or APSK may be used.

[Second Embodiment]

Figure 9:
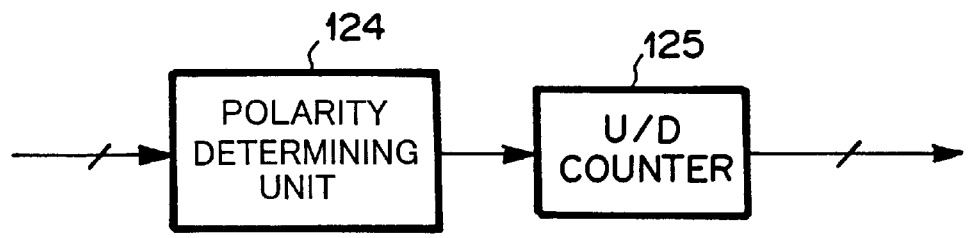
FIG. 9 is a block diagram showing the structure of an LPF according to a second embodiment of the present invention.

Next, with reference to FIG. 9, a second embodiment of the present invention will be described. FIG. 9 is a block diagram showing a second example of the structure of each of the LPFs 103 and 104 of the DC offset controller 10. In FIG. 9, each of the LPFs 103 and 104 comprises a polarity determining unit 124 and an up-down counter U/D 125.

The polarity determining unit 124 represents only two states of positive and negative unlike with the polarity determining unit 121 shown in FIG. 7. Thus, the polarity determining unit 124 outputs only one bit. The counter U/D 125 performs a count-down operation when the input signal of the polarity determining unit 124 is positive. The counter U/D 125 performs a count-up operation when the input signal of the polarity determining unit 124 is negative. The structure shown in FIG. 9 is simpler than the structure shown in FIG. 7. Thus, in the structure shown in FIG. 9, the circuit scale can be reduced.

In addition, each of the LPFs 103 and 104 may be a quadratic LPF. In this case, although the circuit scale slightly becomes large, the follow-up characteristics and initial response characteristics due to a fluctuation of the DC offset components can be improved.

[Third Embodiment]

Figure 10:
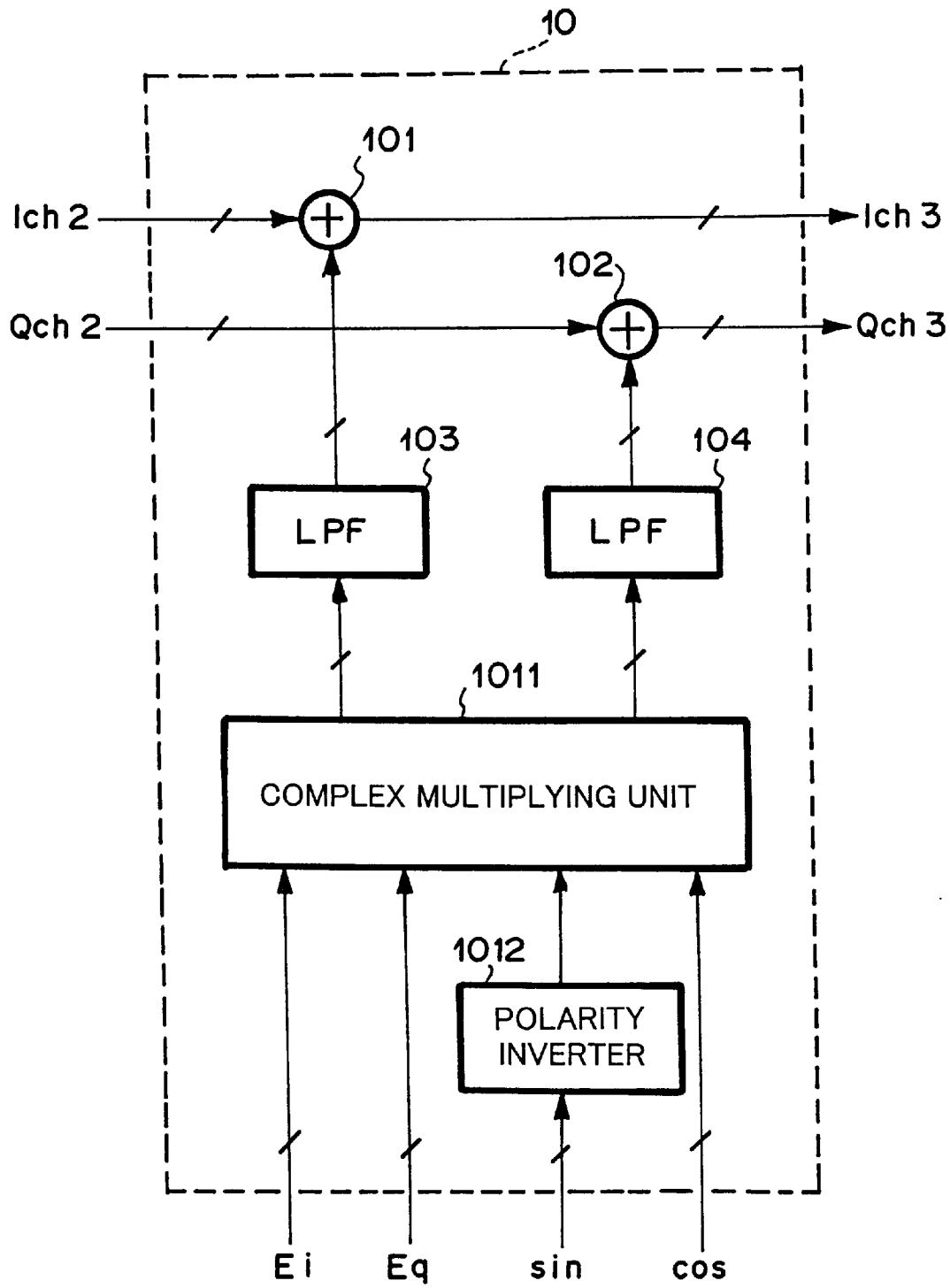
FIG. 10 is a block diagram showing the structure of a DC offset controller according to a third embodiment of the present invention.
Figure 11:
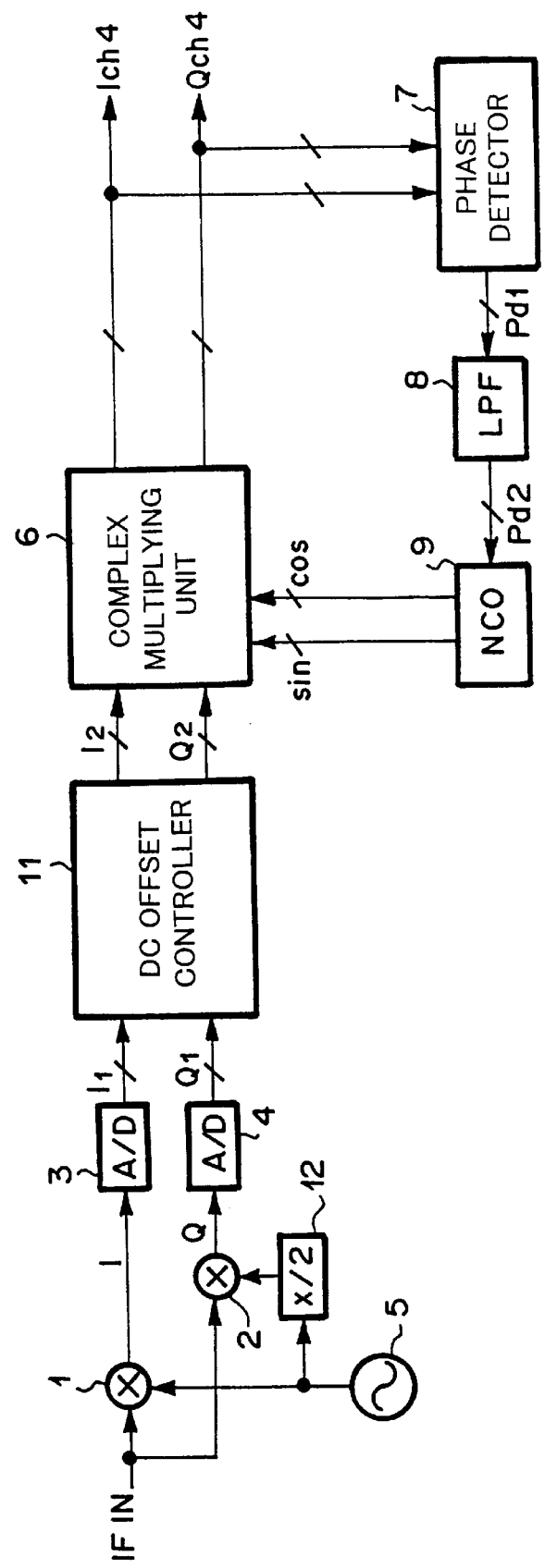
FIG. 11 is a block diagram showing the structure of a conventional demodulator.
Figure 12:
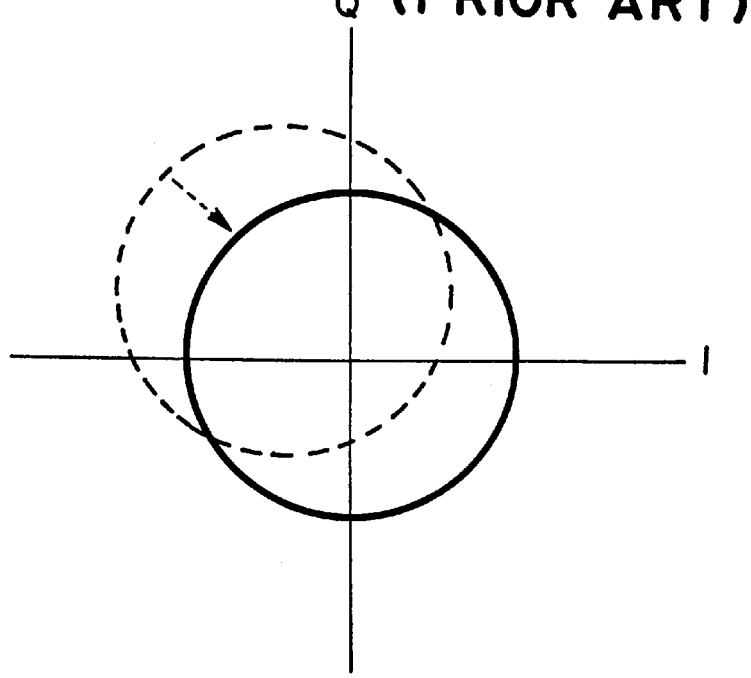
FIG. 12 is a graph showing I-Q characteristics of a conventional DC offset control.
Figure 13:
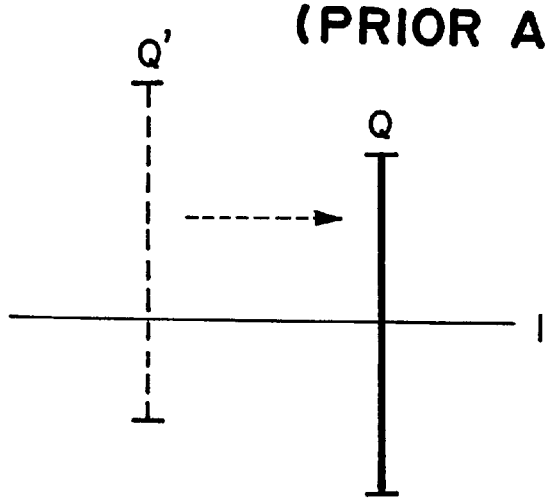
FIG. 13 is a graph showing I-Q characteristics of a conventional DC offset control.

Next, with reference to FIG. 10, a third embodiment of the present invention will be described. FIG. 3 is a block diagram showing the structure of a DC offset controller 10 according to a third embodiment of the present invention. In the DC offset controller 10 shown in FIG. 10, the complex multiplying unit 6 shown in FIG. 1 is used. In addition, a polarity inverter 1012 is used. The polarity inverter 1012 inverts the polarity of the signal sin and thereby inverts the rotation direction. When a desired signal is represented with a 2's complement, after all bits are inverted, "1" should be added. However, when an error of one LSB is permitted, all bits can be inverted. Thus, when a selector is connected to input/output of the complex multiplying unit 6 and the complex multiplying unit is shared on time division basis, the circuit scale can be reduced.

Thus, according to the present invention, with an error signal against a normal signal position, DC offset control can be performed so that the error signal becomes zero. Consequently, DC offset components can be more accurately removed. Thus, in the case that a modulating method with many value data and short signal distance is used, the error rate characteristics are further improved.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A demodulator for use with a digital wireless communication system, comprising:

a DC offset controller for removing a DC offset of a modulated signal that is input to the demodulator;

a complex multiplying unit for complex-multiplying an output signal of said DC offset controller;

a phase detector for detecting an amplitude error signal and a phase error signal from an output signal of said complex multiplying unit;

an LPF (low pass filter) for outputting a low band component of the phase error signal; and an NCO (numerical controlled oscillator) for converting an output signal of said LPF into a sin component and a cos component that have orthogonal relation, wherein the sin component and the cos component are input to said complex multiplying unit, and wherein the amplitude error signal, the sin component, and the cos component are input to said DC offset controller.

2. The demodulator as set forth in claim 1, wherein said phase detector multiplies and adds an output signal of said complex multiplying unit and the amplitude error signal that is output from said error detector and obtains the phase error signal.

3. The demodulator as set forth in claim 1, wherein said LPF multiplies a predetermined coefficient by the phase error signal, integrates the resultant signal for a predetermined time period, multiplies a second predetermined coefficient by the integrated result, multiplies the second predetermined coefficient by the phase error signal, and adds the multiplied results.

4. The demodulator as set forth in claim 1, wherein said NCO has:

an integrating unit for integrating the phase error signal component of said LPF;

a sin converter for generating the sin component; and a cos converter for generating the cos component.

5. The demodulator as set forth in claim 1, wherein said complex multiplying unit multiplies an output signal of said DC offset controller by the sin component, multiplies the output signal of said DC offset controller by the cos component, adds one of the multiplied results and the other of the multiplied results, subtracts one of the multiplied results from the other of the multiplied results, and outputs the results.

6. The demodulator as set forth in claim 1, wherein said DC offset controller multiplies the amplitude error signal by the sin component, multiplies the amplitude error signal by the cos component, adds one of the multiplied results and the other of the multiplied results, subtracts one of the multiplied results from the other of the multiplied results, extracts low band components of the added result and the subtracted result through said LPF, adds the low band components to or subtracts the low band components from the orthogonal modulated signal component, and outputs the result as an orthogonal modulated signal component.

7. A digital wireless communication receiver having a demodulator for demodulating transmitted digital data, wherein the demodulator is the demodulator as set forth in claim 1.

8. The demodulator as set forth in claim 2, wherein said LPF multiplies a predetermined coefficient by the phase error signal, integrates the resultant signal for a predetermined time period, multiplies a second predetermined coefficient by the integrated result, multiplies the second predetermined coefficient by the phase error signal, and adds the multiplied results.

9. The demodulator as set forth in claim 2, wherein said NCO has:

an integrating unit for integrating the phase error signal component of said LPF;

a sin converter for generating the sin component; and a cos converter for generating the cos component.

10. The demodulator as set forth in claim 2, wherein said complex multiplying unit multiplies an output signal of said DC offset controller by the sin component, multiplies the output signal of said DC offset controller by the cos component, adds one of the multiplied results and the other of the multiplied results, subtracts one of the multiplied results from the other of the multiplied results, and outputs the results.

11. The demodulator as set forth in claim 2, wherein said DC offset controller multiplies the amplitude error signal by the sin component, multiplies the amplitude error signal by the cos component, adds one of the multiplied results and the other of the multiplied results, subtracts one of the multiplied results from the other of the multiplied results, extracts low band components of the added result and the subtracted result through said LPF, adds the low band components to or subtracts the low band components from the orthogonal modulated signal component, and outputs the result as an orthogonal modulated signal component.

12. A digital wireless communication receiver having a demodulator for demodulating transmitted digital data, wherein the demodulator is the demodulator as set forth in claim 2.

13. The demodulator as set forth in claim 3, wherein said NCO has:

an integrating unit for integrating the phase error signal component of said LPF;

a sin converter for generating the sin component; and a cos converter for generating the cos component.

14. The demodulator as set forth in claim 3, wherein said complex multiplying unit multiplies an output signal of said DC offset controller by the sin component, multiplies the output signal of said DC offset controller by the cos component, adds one of the multiplied results and the other of the multiplied results, subtracts one of the multiplied results from the other of the multiplied results, and outputs the results.

15. The demodulator as set forth in claim 3, wherein said DC offset controller multiplies the amplitude error signal by the sin component, multiplies the amplitude error signal by the cos component, adds one of the multiplied results and the other of the multiplied results, subtracts one of the multiplied results from the other of the multiplied results, extracts low band components of the added result and the subtracted result through said LPF, adds the low band components to or subtracts the low band components from the orthogonal modulated signal component, and outputs the result as an orthogonal modulated signal component.

16. A digital wireless communication receiver having a demodulator for demodulating transmitted digital data, wherein the demodulator is the demodulator as set forth in claim 3.

17. A digital wireless communication receiver having a demodulator for demodulating transmitted digital data.

18. A demodulator for a digital communication system, comprising:

a DC offset controller which removes a DC offset from a modulated signal input into the demodulator;

a correction circuit which removes phase offset from a signal output from the DC offset controller;

a detector connected to the correction circuit, said detector detecting amplitude error information and phase error information from an output of said correction circuit, wherein said DC offset controller removes DC offset from said modulated signal based on said amplitude error information and said phase error information detected by said detector.

19. The demodulator as set forth in claim 18, further comprising:

a circuit, connected to said detector, which generates rotational angle correction information from said phase error information.

20. The demodulator as set forth in claim 19, wherein said DC offset controller removes said DC offset by multiplying said amplitude error information by said rotational angle correction information.

21. The demodulator as set forth in claim 18, wherein said amplitude error information is detected based on an amount by which the input modulated signal deviates from a predetermined signal point position.

22. The demodulator as set forth in claim 19, wherein said phase error information is determined based on said amplitude error information and polarity signals.

23. The demodulator as set forth in claim 19, wherein said correction circuit multiplies an output of the DC offset controller by said rotational angle correction information to remove said phase offset.

* * * * *